(12) United States Patent
Saitoh et al.

(10) Patent No.: US 7,586,781 B2
(45) Date of Patent: Sep. 8, 2009

(54) MAGNETO-RESISTANCE EFFECT ELEMENT AND MAGNETIC MEMORY DEVICE

(75) Inventors: Eiji Saitoh, Yokohama (JP); Hideki Miyajima, Yokohama (JP)

(73) Assignee: Keio University, Tokyo (JP)

( * ) Notice: Subject to any disclaimer, the term of this patent is extended or adjusted under 35 U.S.C. 154(b) by 112 days.

(21) Appl. No.: 11/666,172

(22) PCT Filed: Oct. 26, 2005

(86) PCT No.: PCT/JP2005/019666

§ 371 (c)(1),
(2), (4) Date: Apr. 25, 2007

(87) PCT Pub. No.: WO2006/046591

PCT Pub. Date: Apr. 5, 2006

(65) Prior Publication Data

US 2008/0130355 A1    Jun. 5, 2008

(30) Foreign Application Priority Data

Oct. 27, 2004   (JP)   .............................. 2004-311880

(51) Int. Cl.
*G11C 11/00*   (2006.01)
*G11C 11/14*   (2006.01)
*G11C 11/15*   (2006.01)

(52) U.S. Cl. .................. 365/158; 365/171; 365/173

(58) Field of Classification Search .................. 365/158
See application file for complete search history.

(56) References Cited

U.S. PATENT DOCUMENTS 6,834,005 B1 * 12/2004 Parkin .......................... 365/80
6,970,379 B2 * 11/2005 Parkin ......................... 365/173
7,102,477 B2 * 9/2006 Bland et al. .................. 335/302

(Continued)

FOREIGN PATENT DOCUMENTS

JP    01082383 A  *  3/1989

(Continued)

OTHER PUBLICATIONS

A. Yamaguchi et al.; "Real-Space Observation of Current-Driven Domain Wall Motion in submicron Magnetic Wires"; Physical Review Letters, vol. 92, No. 7, Feb. 20, 2004, pp. 077205-1 to 077205-4. Cited in the International Search Report.

(Continued)

*Primary Examiner*—Son L Mai
(74) *Attorney, Agent, or Firm*—Westerman, Hattori, Daniels & Adrian, LLP.

(57) ABSTRACT

The invention relates to a magneto-resistance effect element and a magnetic memory device. Lowering the magnetic domain wall movement current and drive at room temperature in a current induction single magnetic domain wall movement phenomenon are achieved.

A magneto-resistance effect element is formed by including at least: a magnet wire 1 for forming magnetic domain wall potential 7 binding a single magnetic domain wall 2; a magnetic field applying means for generating a magnetic field for introducing the single magnetic domain wall 2 into the magnet wire 1; and a drive current applying means for applying the current 3 including a resonance frequency component determined on the basis of the magnetic domain wall potential 7.

5 Claims, 14 Drawing Sheets

U.S. PATENT DOCUMENTS

| | | | |
|---|---|---|---|
| 2004/0021539 A1* | 2/2004 | Bland et al. | 335/302 |
| 2007/0090835 A1* | 4/2007 | Pullini et al. | 324/252 |
| 2007/0242505 A1* | 10/2007 | Ochiai et al. | 365/171 |
| 2008/0025060 A1* | 1/2008 | Lim et al. | 365/86 |
| 2008/0068880 A1* | 3/2008 | Lim et al. | 365/173 |
| 2008/0158707 A1* | 7/2008 | Lee et al. | 360/55 |

FOREIGN PATENT DOCUMENTS

| | | |
|---|---|---|
| JP | 2003-17782 A | 1/2003 |
| JP | 2003-281705 A | 10/2003 |
| JP | 2004-6774 A | 1/2004 |
| JP | 2005-191032 A | 7/2005 |
| WO | WO 2005/069368 A1 | 7/2005 |

OTHER PUBLICATIONS

G. Tatara et al.; "Theory of Current-Driven Domain Wall Motion: Spin Transfer versus Momentum Transfer"; Physical Review Letters, vol. 92, No. 8, Feb. 27, 2004, pp. 086601-1 to 086601-4.

J. Grollier et al; "Switching a spin valve back and forth by current-induced domain wall motion"; Applied Physics Letters, vol. 83, No. 2, Jul. 21, 2003, pp. 509-511.

C. K. Lim et al.; "Domain wall displacement induced by subnanosecond pulsed current"; Applied Physics Letters, vol. 84, No. 15, Apr. 12, 2004, pp. 2820 to 2822.

H. Koo et al.; "Current-controlled bi-stable domain configurations in $Ni_{81}Fe_{19}$ elements: An approach to magnetic memory devices"; Applied Physics Letters, vol. 81, No. 5, Jul. 29, 2002, pp. 862 to 864.

L. Berger; "Exchange interaction between ferromagnetic domain wall and electric current in very thin metallic films"; J. Apply Phys., vol. 55, No. 6, Mar. 15, 1984, pp. 1954 to 1956.

M. Yamaguchi et al.; "Current-induced domain-wall switching in a ferromagnetic semiconductor structure"; Letters to Nature, vol. 428, Apr. 1, 2004, pp. 539 to 542.

International Search Report of PCT/JP2005/19666, date of mailing Jan. 31, 2006.

* cited by examiner

F I G . 1
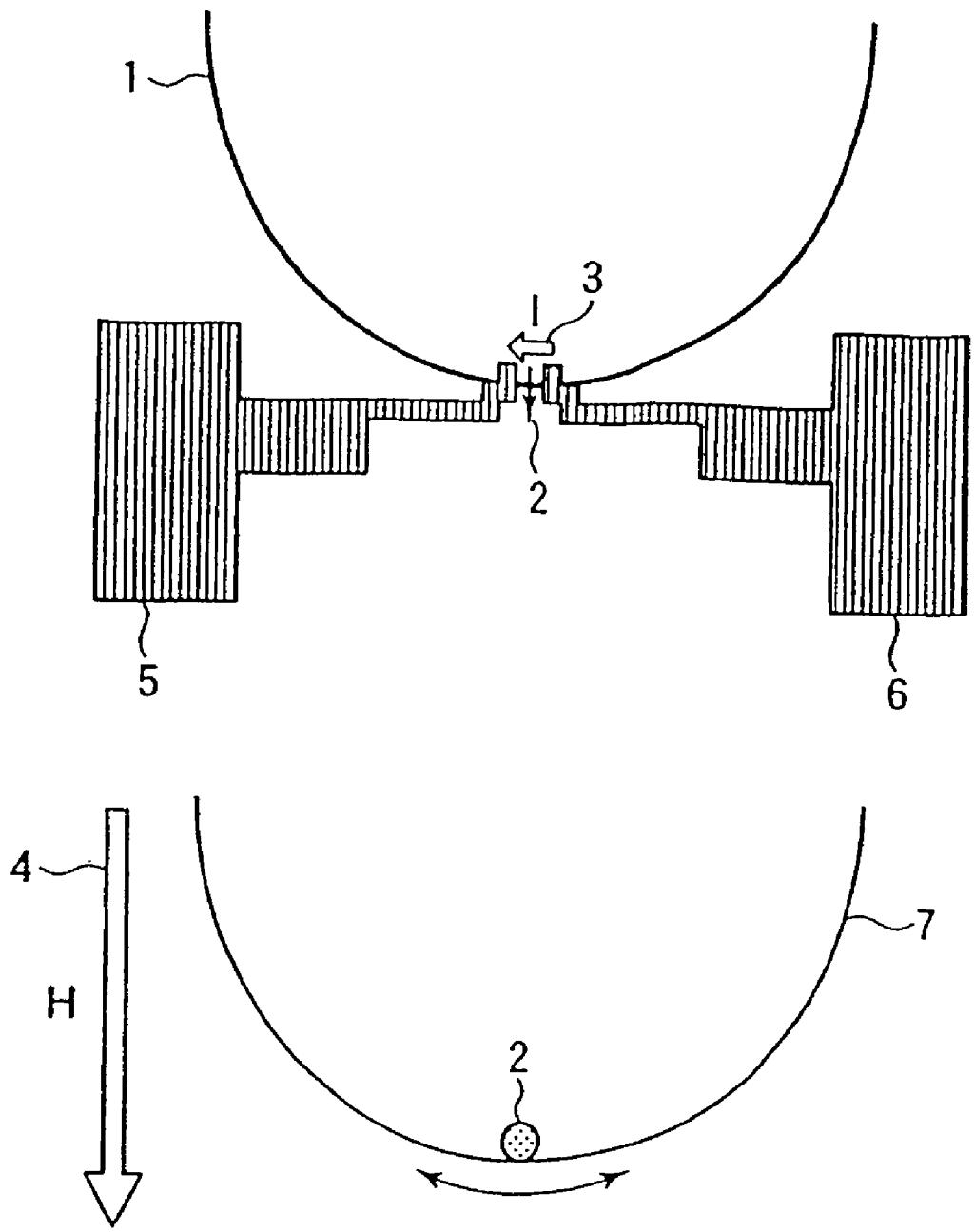

F I G. 3
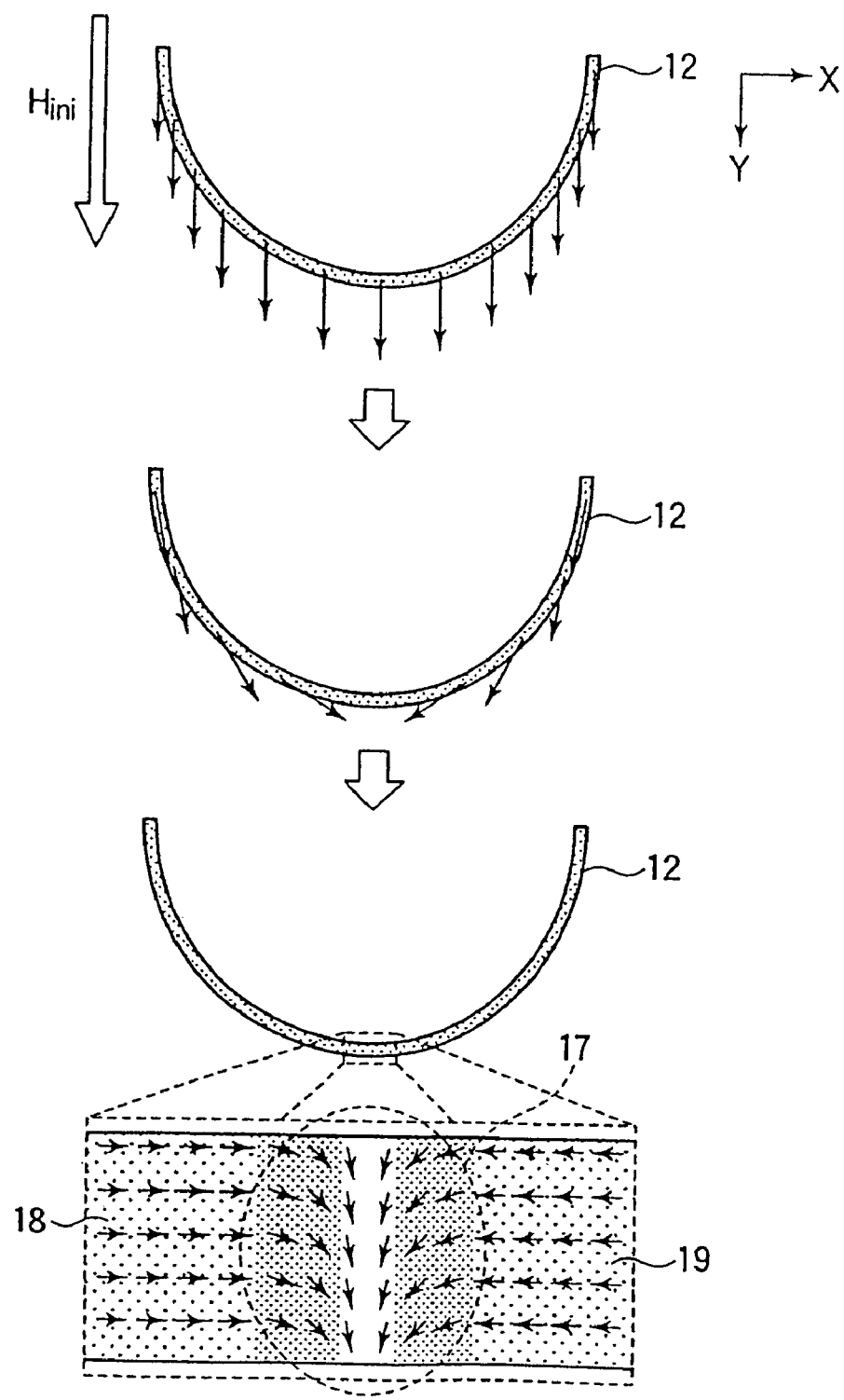

F I G. 5
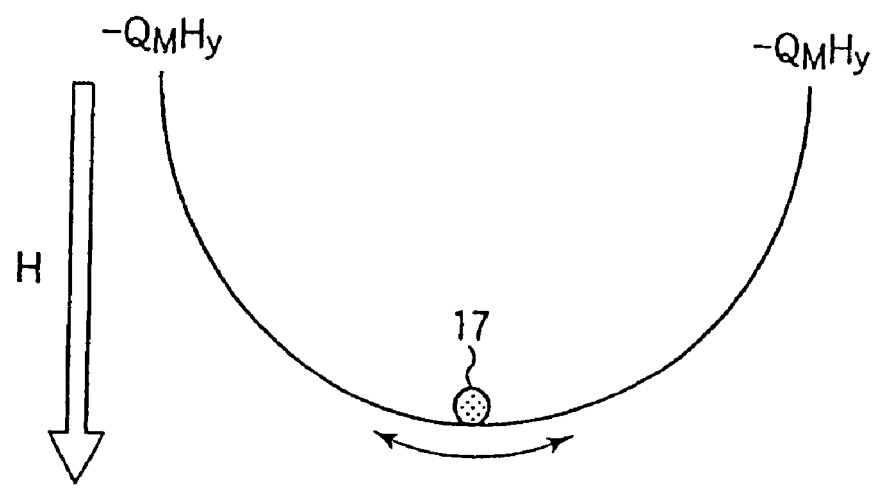
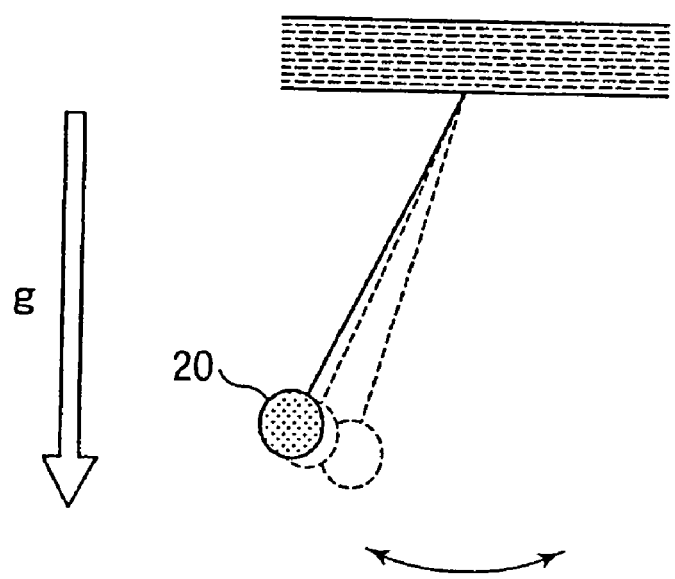

F I G . 6
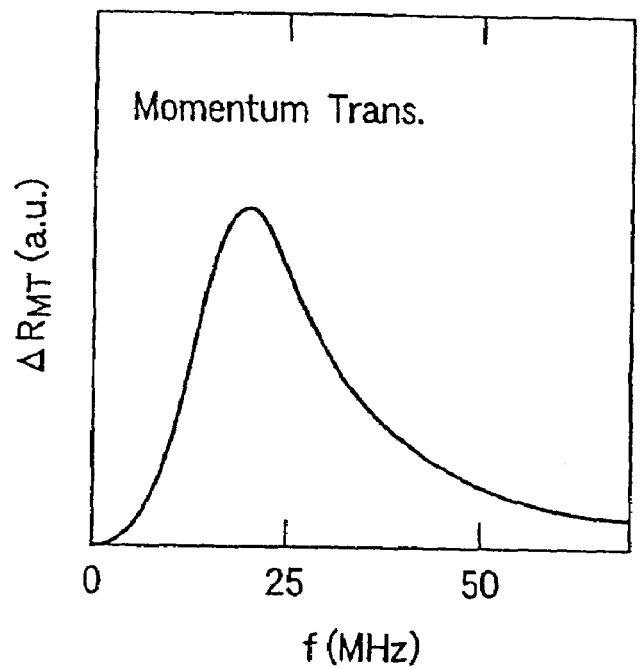
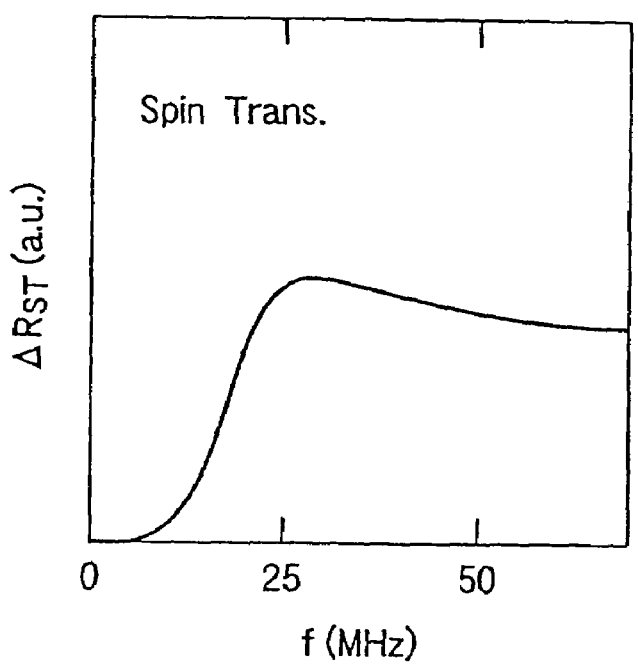

FIG. 7
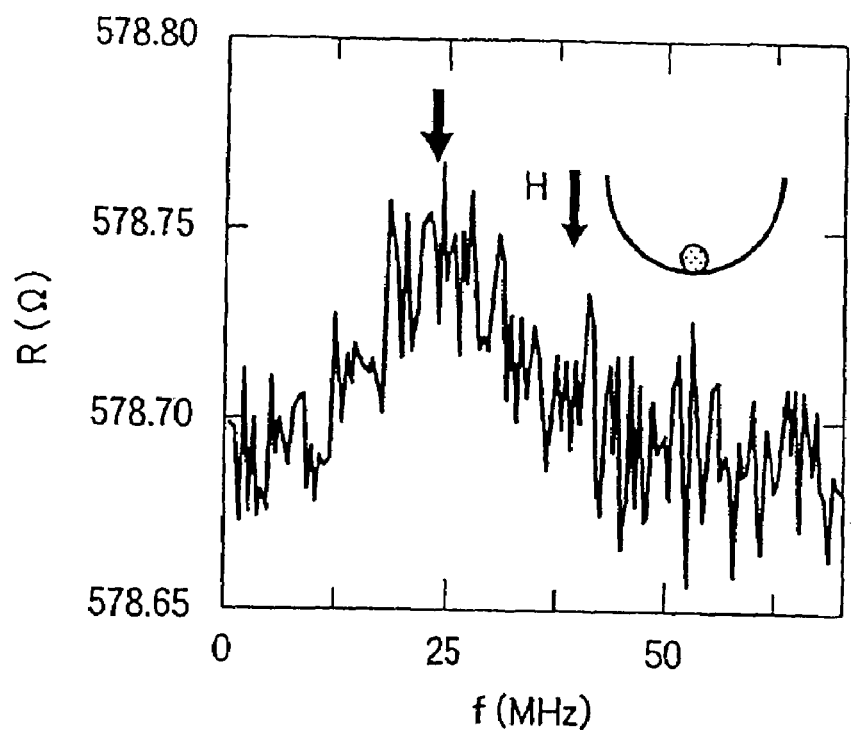
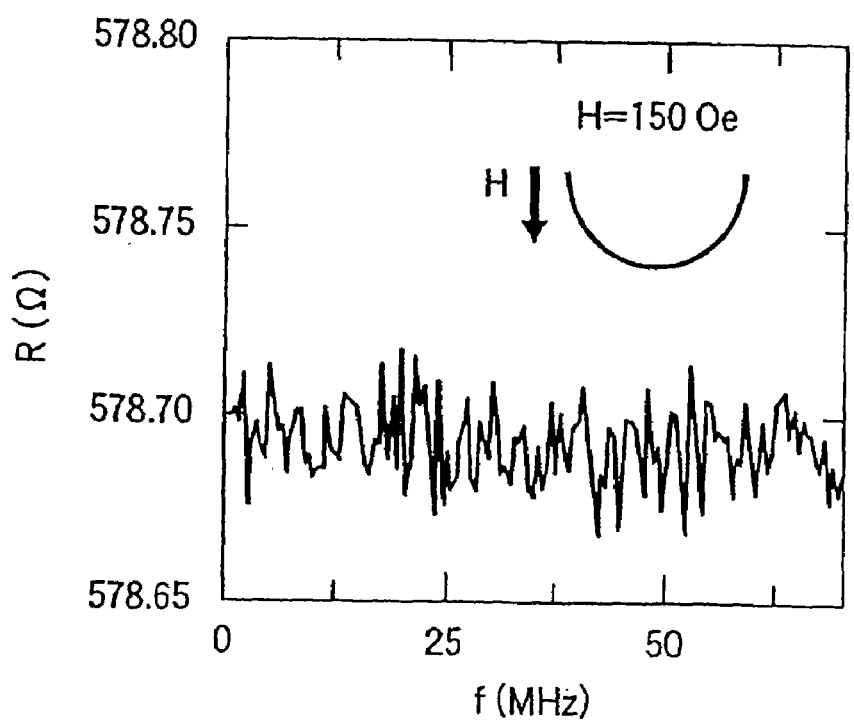

F I G . 1 8
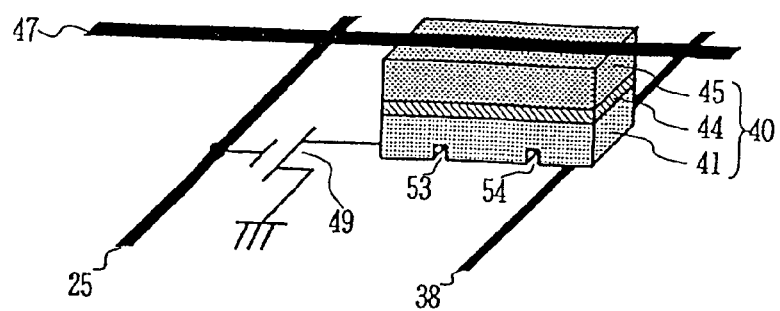
F I G . 1 9
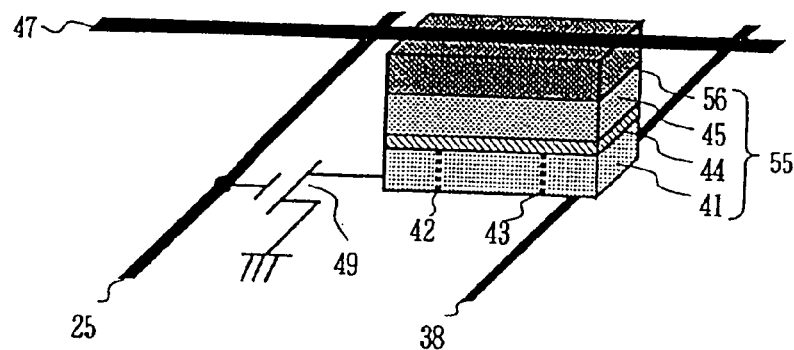

FIG. 20 (PRIOR ART)
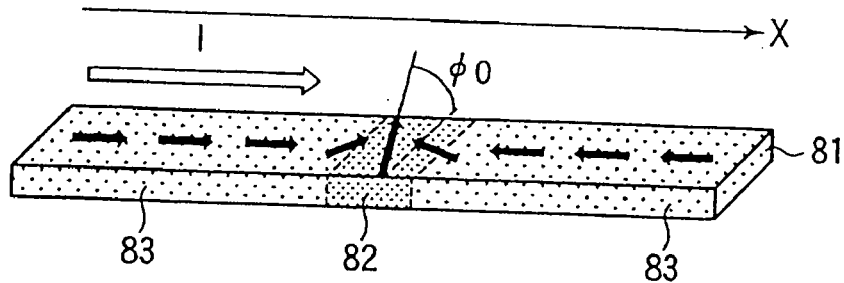
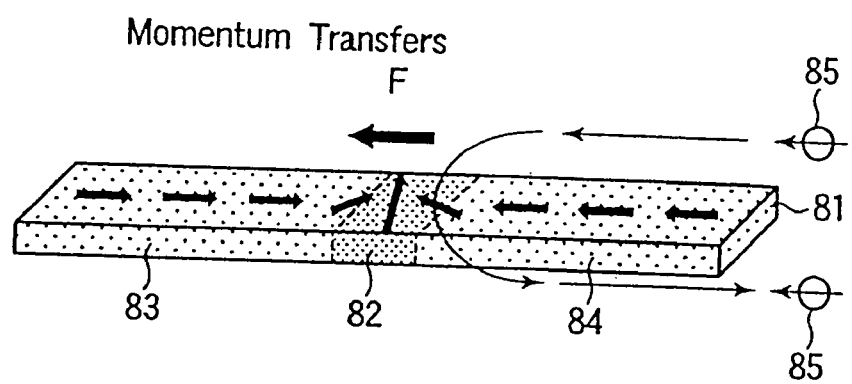
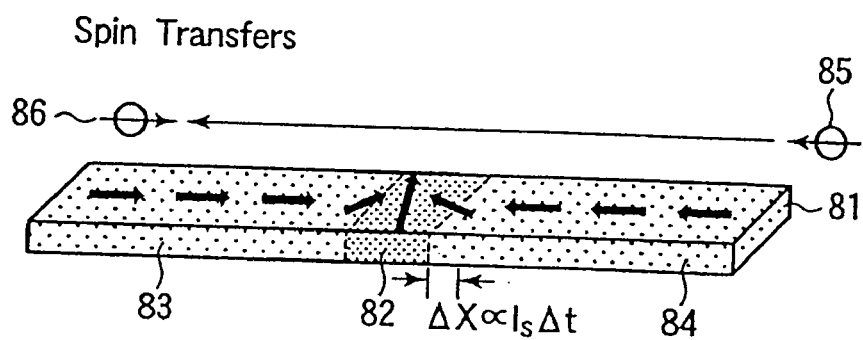

MAGNETO-RESISTANCE EFFECT ELEMENT AND MAGNETIC MEMORY DEVICE

TECHNICAL FIELD

The present invention relates to a magneto-resistance effect element and a magnetic memory device, particularly, a magneto-resistance effect element and a magnetic memory device, which have a characteristic structure for carrying out movement of a single magnetic domain wall introduced into a magnetic material with the low current.

BACKGROUND ART

A magnetic sensor and a magnetic head, which utilize a magneto-resistance effect phenomenon that applying a magnetic field into a magnetic structure such as a spin valve structure causes a change in electric resistance, have been developed and used in practice.

In recent years, noticed having been a magnetic random access memory (MRAM) using such a magneto-resistance effect. In the magnetic random access memory, the electric current is let flow into the magnetic structure to correspond to digital information of "0" or "1" by using a fact that the resistance value is changed in accordance with a direction of a spin of an electron in a magnetic material.

In such an MRAM, a magnetic field generated by a current flow into a writing line is used for determining a direction of magnetization of a free layer, which is to be a writing layer, to write data in the vicinity of a memory cell. A structure of the memory cell, however, should be made minute in accordance with a recent request for higher density.

The current for generating a magnetic field necessary for inverting a direction of magnetization of a ferromagnet comprising the free layer should be several mA or more when the memory cell is made minute. Accordingly, the consumption power increases and the Joule heat is generated, so that problems occur. These are great causes preventing a memory from being made higher in density.

In order to solve such problems, proposed have been a current induction magnetic structure changing type MRAM in which the direction of magnetization of a free layer is inverted not by application of a magnetic field but by injection of a spin polarization electron into a free layer (Patent References 1 to 3, for example).

Such a current induction magnetic structure changing type MRAM has problems that necessity of a new mechanism for injecting a spin polarization electron into a free layer causes a complicated structure of a memory cell and that lowering in writing current is not always enough.

On the other hand, also proposed has been application of a phenomenon to a magnetic memory, the phenomenon that a flow of a current into a minute magnetic material causes a magnetic domain wall formed in the magnetic material to move (refer to Non-Patent Reference 1 or 2, for example).

Such a phenomenon that a flow of a current into a minute magnetic material causes a magnetic domain wall formed in the magnetic material to move has been known from a long time ago. It has been known that a localized magnetic domain wall behaves as a particle with inertia, namely, the pseudo mass "m" due to the angular momentum of spins.

A theoretical analysis relating to such a mechanism of movement of a magnetic domain wall has been proposed recently (refer to Non-Patent Reference 3, for example). Accordingly, the mechanism of movement of a magnetic domain wall will be described now, made reference to FIG. 20.

Refer to FIG. 20.

FIG. 20 is a conceptually perspective view of a mechanism of movement of a magnetic domain wall. The upper drawing shows a case that a current "I" is let flow into a magnet wire 81 in which a single magnetic domain wall is formed. A flow of the current "I" in the magnet wire 81 in an X direction from the left side causes a momentum of an electron to operate on a single magnetic domain wall 82 so that a magnetic moment of the single magnetic domain wall 82 would rise to move with torsion at an angle $\phi_0$ in a Z direction.

As a mechanism contributing to the movement in the above case, there are two mechanisms: one is momentum transfer with an electron; and one is electron angular momentum, namely, spin transfer.

The middle drawing in FIG. 20 illustrates the momentum transfer. A flow of the current "I" from the left corresponds to a flow of an electron 85 from the right. The electron 85 flowing from the right gives the single magnetic domain wall 82 momentum of the electron 85 when the electron 85 is scattered interactively with the single magnetic domain wall 82 by the spin of the electron 85. Accordingly, the single magnetic domain wall 82 is to move in a −X direction. Force $F_{MT}$ operating on the single magnetic domain wall 82 in the above case is proportional to a quantity of the electron 85, namely, the current "I", and thereby, expressed by:

$$F_{MT} \propto I.$$

The lower drawing in FIG. 20 illustrates the spin transfer. In the case that the current "I" flows from the left and the electron 85 passes over the single magnetic domain wall 82, the spin of an electron 86 flowing into a magnetic section 83 is accorded with a direction of the magnetic moment of the magnetic section 83. This causes the area of the magnetic section 83 to be increased, so that the single magnetic domain wall 82 moves in the X direction.

A moving amount ΔX for a minute time Δt in the above case is proportional to the spin amount of an electron, namely, a spin current $I_s$. Accordingly, $$\Delta X \propto I_s \Delta t,$$

and in accordance with the above proportional relation, $$dX/dt = I_s$$

can be assumed.

In the above assumption, the force $F_{ST}$ of the operation of the spin is secondary differential of the displacement amount X for time and expressed by:

$$F_{ST} \propto d^2X/dt^2 \propto dI_S/dt.$$

In such current induction magnetic domain wall movement, an operation described with respect to the spin transfer can be considered to be superior since a size of the single magnetic domain wall 82 is nm in order and long enough for a sub nano-order of a wavelength of the electron 85. This does not contradict results of various kinds of experiments using a direct current or a pulse current (refer to Non-Patent Reference 4, for example).

Patent Reference 1: JP-A-2003-017782
Patent Reference 2: JP-A-2003-281705
Patent Reference 3: JP-A-2004-006774
Non-Patent Reference 1: Applied Physics Letters, Vol. 81, No. 5, pp. 862-864, 29 Jul. 2002
Non-Patent Reference 2: Nature, Vol. 428, pp. 539-542, 1 Apr. 2004
Non-Patent Reference 3: Physical Review Letters, Vol. 92, 086601, 27 Feb. 2004

Non-Patent Reference 4: Applied Physics Letters, Vol. 83, p. 509, 2003

DISCLOSURE OF THE INVENTION

Problems that the Invention is to Solve

In the above-mentioned current induction magnetic domain wall movement, however, the direct current required for movement of the single magnetic domain wall is still large, and therefore, there is a problem that power consumption reduction is difficult even when the above phenomenon is utilized for a magnetic device such as an MRAM.

Further, in Non-Patent Reference 2 mentioned above, required is a cryogenic condition in the vicinity of liquid $N_2$ temperature as a drive condition since a magnetic semiconductor is used. This causes a problem that Non-Patent Reference 2 is be applicable to an MRAM operated at room temperature.

Accordingly, an object of the invention is to achieve lowering of the magnetic domain wall movement current in a magnetic device utilizing a current induction single magnetic domain wall movement phenomenon and to achieve drive at room temperature of the magnetic device.

Means for Solving the Problems

Now, means for solving the problems in the invention will be described, made reference to FIG. 1. The upper drawing in FIG. 1 is a conceptual plan view of a magneto-resistance effect element. The lower drawing in FIG. 1 illustrates potential energy.

Numerals 5 and 6 in FIG. 1 denote electrodes for letting a current 3 flow into a magnet wire 1.

Refer to FIG. 1

(1) In order to solve the above problems, the invention is characterized in that a magneto-resistance effect element includes at least: a magnet wire 1 for forming magnetic domain wall potential 7 binding a single magnetic domain wall 2; a magnetic field applying means for generating a magnetic field for introducing the single magnetic domain wall 2 into the magnet wire 1; and a drive current applying means for applying the current 3 including a resonance frequency component determined on the basis of the magnetic domain wall potential 7.

As described above, applying the current 3 including a resonance frequency component determined on the basis of the magnetic domain wall potential 7 allows the single magnetic domain wall 2 to be moved with the current lower than the conventional case. The current consumption according to the movement of the single magnetic domain wall 2 is reflected in increase in resistance. Accordingly, the phenomenon can be utilized to form a magnetic sensor.

(2) Further, the invention is characterized in that, in (1), the magnet wire 1 is formed from an arc-shaped magnet loop and comprises a bound external magnetic field applying means for applying a bound external magnetic field 4 binding the single magnetic domain wall 2 and the magnetic domain wall potential 7 depends on the shape of the magnet loop and the bound external magnetic field 4.

As described above, the magnetic-shape anisotropy of the magnetic material allows the single magnetic domain wall 2 to be formed at the center of the magnet loop when the magnet wire 1 is formed from an arc-shaped magnet loop.

Further, applying the bound external magnetic field 4 to such a magnet loop allows the resonance frequency to be freely fluctuated.

(3) Moreover, the invention is characterized in that, in (1), the magnetic domain wall potential 7 is formed in any of a magnetic deterioration area locally formed in the magnet wire 1 and a shape defect area.

As described above, the magnetic domain wall potential 7 may be formed in any of a magnetic deterioration area locally formed in the magnet wire 1, an ion injection area, for example, and a shape defect area, an area in which at least one of the width and thickness of the magnetic material is changed, for example. The magnetic deterioration area or the shape defect area is used as the pinning area. In this case, the size of the magneto-resistance effect element per se can be sufficiently reduced.

(4) In addition, the invention is characterized in that a magnetic memory device includes at least a magneto-resistive storage element including a first magnet layer provided with two pinning areas on a semiconductor substrate and a second magnet layer having a fixed magnetization direction, the first magnet layer and the second magnet layer laminated through a nonmagnetic middle layer, wherein a first wiring layer is connected to one end of the first magnet layer while a second wiring layer is connected to the other end of the first magnet layer, the second magnet layer is connected to a third wiring layer, a current including a resonance frequency component determined on the basis of the magnetic domain wall potential in the vicinity of the pinning area is let flow between the first wiring and the second wiring to move the single magnetic domain wall bound in the pinning area of the first magnet layer so as to write information and a voltage is applied between the first wiring and the third wiring to detect a current flowing between the first wiring and the third wiring so as to read out information.

Applying such a structure allows the writing current in a current induction magnetic domain wall movement type MRAM to be lowered and consumption power to be reduced. Further, a cell structure can be simplified since a specific structure such as a spin polarization electron injection layer for writing is not necessary.

In the above case, the pinning area may be formed from a magnetic deterioration area formed in the first magnet layer, a magnetic deterioration area formed from an ion injection area, for example.

The pinning area otherwise may be formed from a shape defect area formed in the first magnet layer, a shape defect area formed from a narrow area formed in a longitudinal direction of the first magnet layer or a thin area formed in a longitudinal direction of the first magnet layer, for example.

Moreover, the nonmagnetic middle layer may be formed from a tunnel insulation film or a nonmagnetic conductive film.

It is also possible that an anti-ferromagnetic layer is provided on an opposite side to the nonmagnetic middle layer of the second magnet layer.

EFFECT OF THE INVENTION

In accordance with the invention, a current including a resonance frequency component determined on the basis of magnetic domain wall potential is used as a current for moving a single magnetic domain wall. This allows the single magnetic domain wall to move with a low current at room temperature.

Moreover, applying a principle of the invention to a magnetic memory device allows a magnetic memory device, which is high in density and capable of writing with low current and low in consumption power, to be achieved.

BRIEF DESCRIPTION OF THE DRAWINGS

FIG. 1 illustrates a structure of a principle of the invention.

FIG. 3 illustrates a method of introducing a single magnetic domain wall.

FIG. 5 illustrates potential energy of a single magnetic domain wall.

FIG. 6 illustrates frequency dependency of $\Delta R(f)$.

FIG. 7 illustrates frequency dependency of a measured resistance R.

FIG. 18 is a schematically perspective view of a magnetic storage part forming an MRAM in Embodiment 4 of the invention.

FIG. 19 is a schematically perspective view of a magnetic storage part forming an MRAM in Embodiment 5 of the invention.

FIG. 20 is a perspective view showing a concept of a mechanism of movement of a magnetic domain wall.

BEST MODE FOR CARRYING OUT THE INVENTION

The invention is to introduce magnetic domain wall potential capable of binding a magnetic domain wall to a magnet wire by any one of shape magnetic anisotropy, a magnetic deterioration area and a shape defect area to bind a single magnetic domain wall in the magnetic domain wall potential and to apply a current including a resonance frequency component determined on the basis of the magnetic domain wall potential in the case of moving the bound single magnetic domain wall.

Further, in a magnetic memory device, a layer corresponding to a free layer in a spin valve structure is used as a data writing layer, two magnetic deterioration areas or shape defect areas are formed in the data writing layer to be a pinning area and a current including a resonance frequency component determined by magnetic domain wall potential is applied from both ends of the data writing layer to write data.

Embodiment 1

Now, a single magnetic domain wall resonance element in Embodiment 1 of the invention will be described, made reference to FIGS. 2 to 11.

Figure 2:
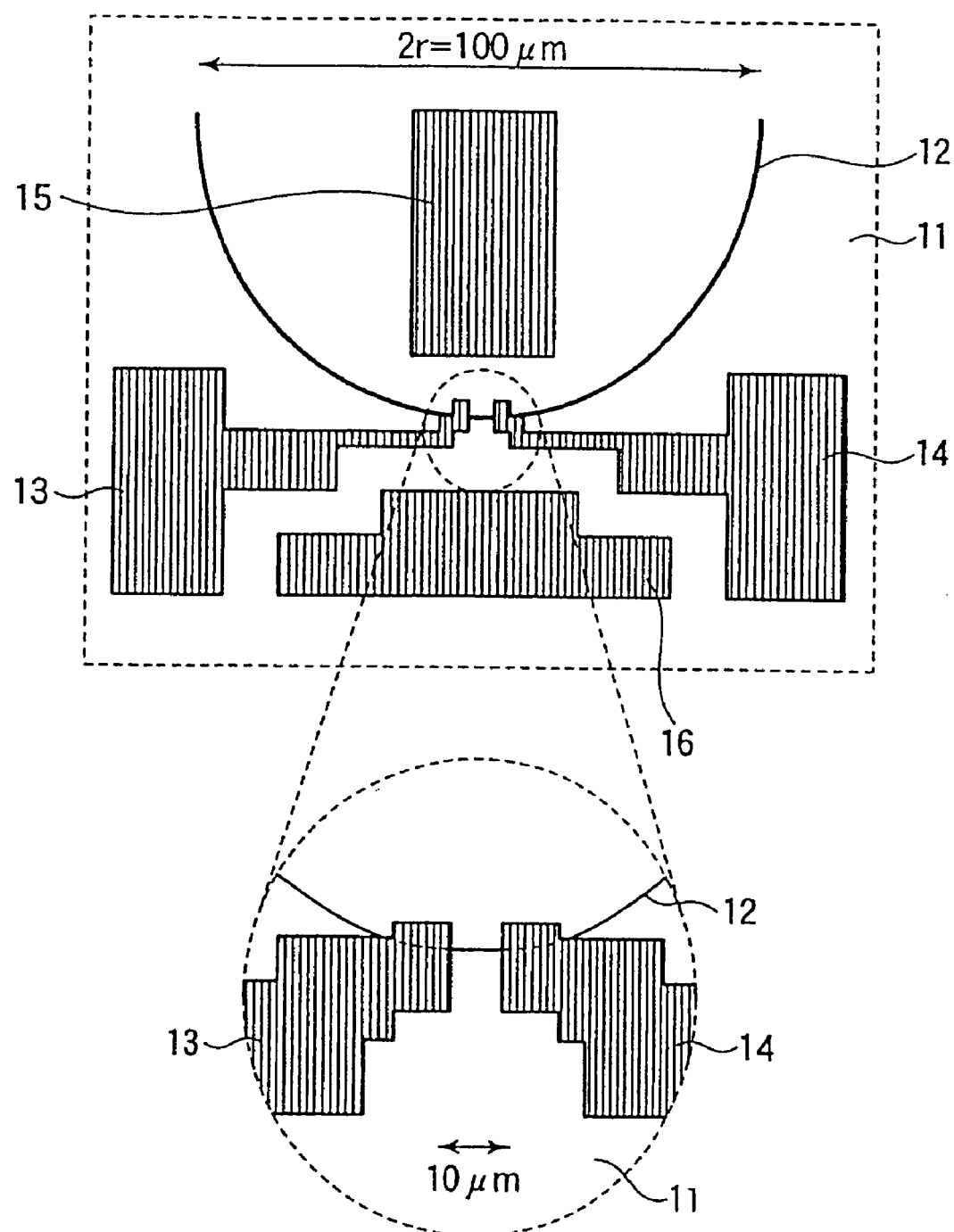
FIG. 2 is a plan view of a single magnetic domain wall resonance element in Embodiment 1 of the invention.

Refer to FIG. 2.

FIG. 2 is a plan view of a single magnetic domain wall resonance element in Embodiment 1 of the invention. In FIG. 2, a resist pattern (omitted from drawing) formed by electronic beam lithography is used as a lift-off pattern to form a film of a soft ferromagnet $Ni_{81}Fe_{10}$ into 45 nm in thickness, for example, by sputtering on a single crystal silicon substrate 11 whose surface is oxidized. The resist pattern is then removed to form a magnet loop 12 in the shape of a half arc, which is 70 nm in width and 50 µm in radius "r", for example.

Following to the above, the sputtering film forming and a lift-off method are used again to form a pair of Cu electrodes 13 and 14 and to provide a pair of Cu earth electrodes 15 and 16 in a direction vertical to a direction that the pair of Cu electrodes 13 and 14 are opposed to each other.

The Cu earth electrodes 15 and 16 are provided for the purpose of preventing the high frequency current from being conducted to the pair of Cu electrodes 13 and 14 through parasitic capacitance and the purpose of matching impedance.

Moreover, the distance between opposed top ends of the pair of the Cu electrodes 13 and 14 is 10 µm, as shown in a circle shown by a broken line. A single magnetic domain wall 17 is designed to be formed in a magnet loop 12 within a range of 10 µm, as described later.

Refer to FIG. 3.

FIG. 3 illustrates a method of introducing a single magnetic domain wall. As shown in FIG. 3, applying an introduction magnetic field $H_{ini}$ of 10 kOe, for example, in the Y direction to the magnet loop 12 causes magnetization in the magnet loop 12 to be aligned in a direction of the introduction magnetic field $H_{ini}$.

Demagnetizing the introduction magnetic field $H_{ini}$ into 0, following to the above, causes the magnetization in the magnet loop 12 to be distorted along the shape of the magnet loop 12 by an operation of strong magnetic-shape anisotropy of the magnet loop 12. This contributes to form the single magnetic domain wall 17 having magnetization in the Y direction at a middle part between left and right magnetic sections 18 and 19 having magnetization directions opposite to each other, namely, at a bottom part of the magnet loop 12.

The length of the single magnetic domain wall 17 in the X direction was confirmed to be almost equal to the width of the magnet loop 12, that is, around 70 nm in accordance with observation of magnetization distribution by means of a magnetic force microscope (MFM).

Figure 4:
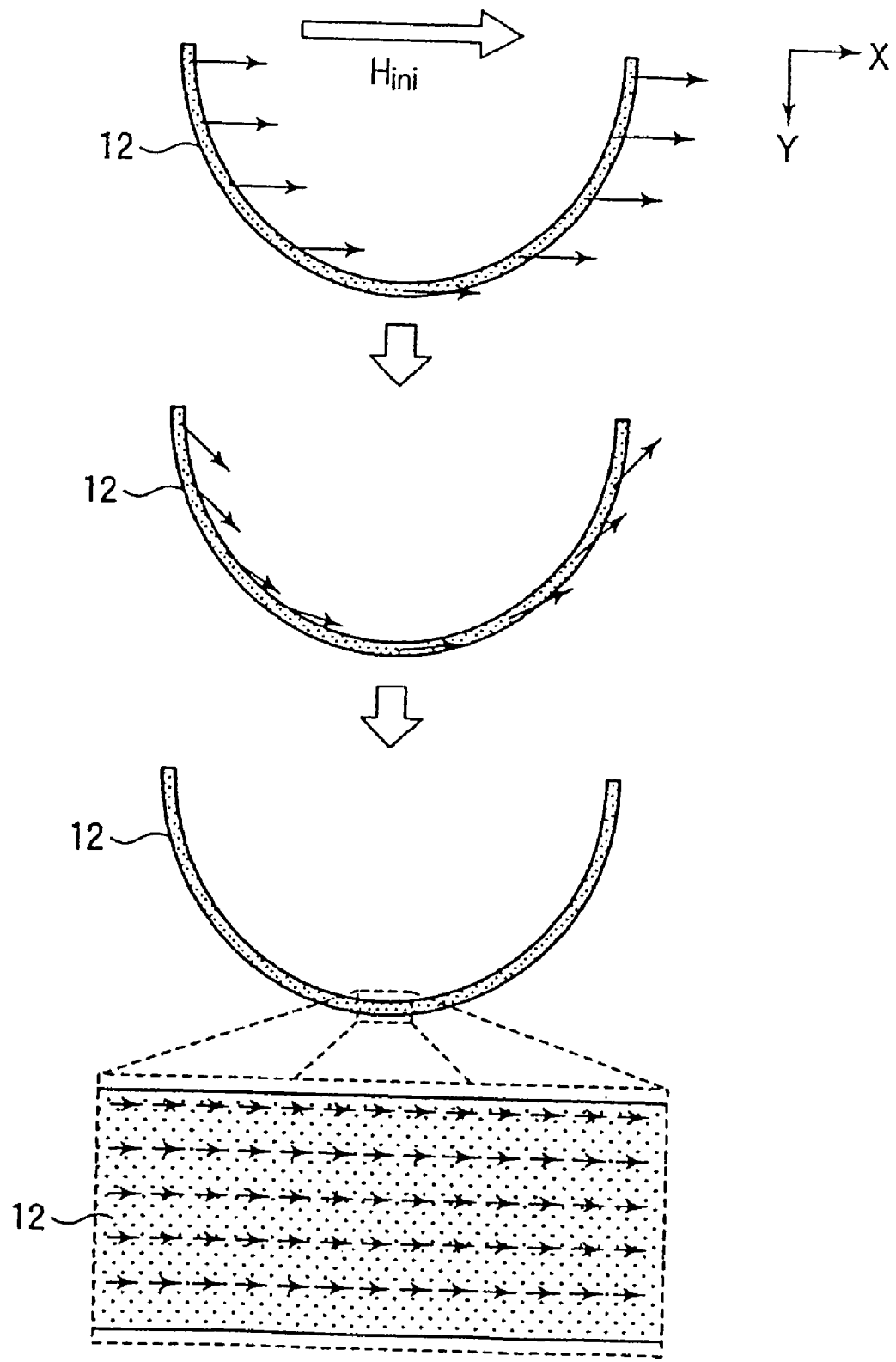
FIG. 4 illustrates a method of eliminating a single magnetic domain wall.

Refer to FIG. 4.

FIG. 4 illustrates a method of eliminating the single magnetic domain wall. As shown in FIG. 4, applying an elimination magnetic field $H_{eli}$ of 10 kOe, for example, in the X direction to the magnet loop 12 causes magnetization in the magnet loop 12 to be aligned in a direction of the introduction magnetic field $H_{eli}$.

Demagnetizing the introduction magnetic field $H_{eli}$ into 0, following to the above, causes the magnetization in the magnet loop 12 to be distorted along the shape of the magnet loop 12 by an operation of strong magnetic-shape anisotropy of the magnet loop 12. This causes the magnet loop 12 to be a single magnetic section as a whole, so that the single magnetic domain wall 17 is eliminated.

Refer to FIG. 5.

FIG. 5 illustrates potential energy of the single magnetic domain wall. As shown in the upper drawing in FIG. 5, the magnetic domain wall potential energy at the both ends of the half-arc-shaped magnet loop 12 is $-Q_M H_y$ when the bound external magnetic field H is applied in the Y direction of the magnet loop 12 in the case that the magnetic domain wall potential energy on the bottom of the magnet loop 12 is assumed to be 0.

In the above context, $Q_M$ is an intrinsic magnetic charge of the magnetic domain wall and expressed by:

$$Q_M = 2M_S S,$$

wherein M denotes the saturation magnetic moment of a magnetic material forming the magnet loop 12 and S denotes the area of a cross section of the magnet loop 12.

Accordingly, in the case that the single magnetic domain wall 17 moves in the bound external magnetic field H, the movement in accordance with an operation of the potential energy formed by the shape of the magnet loop 12 can be considered to be oscillation of a pendulum 20 in a gravity field "g", as shown in FIG. 5.

Therefore, like a swing of a pendulum resonant at a certain frequency, it can be considered that a flow of a high frequency current into the magnet loop 12 with the bound external magnetic field H being applied also causes movement of the single magnetic domain wall 17 to be resonant at a certain frequency $f_q$. A square of the value is expressed by:

$$f_q^2 = Q_M H/(4\pi^2 mr)$$

The force operating on the movement of the single magnetic domain wall 17 formed in the magnet loop 12 can be obtained by minute vibration approximation of an equation of movement of a magnetic domain wall shown in Non-Patent Reference 3 mentioned above as follows:

$$F(f) = F_{TM} + F_{ST}$$

wherein F(f) denotes force operating on the single magnetic domain wall 17, and thereby, approximated by $$F_{TM} = enSIR_{DW}(1 - i\alpha h f/k)$$

$$F_{ST} = -i[h^2/(2\pi eK\lambda)] \cdot fI_S$$

wherein e denotes an element electric charge, "n" denotes a conduction electron density, "S" denotes an area of a cross section of the magnet loop, "I" denotes a drive current, "$R_{DW}$" denotes an electric resistance due to a magnetic domain wall, "i" denotes an imaginary number, "α" denotes an attenuation coefficient due to friction of spin, "K" denotes a shape anisotropy energy constant, "h" denotes a Planck's constant, "f" denotes a frequency of the drive current, "λ" denotes a length of the single magnetic domain wall and "$I_S$" denotes a spin current of the drive current.

When ΔR(f) denotes a difference between a resistance value $R_{withDW}$ of the magnet loop 12 in the case that the force F(f) operates on the single magnetic domain wall 17 and a resistance value $R_{withDW}$ of the magnet loop 12 in the case that the single magnetic domain wall 17 does not exist, $$\Delta R(f) = [1/(8\pi^2 m\tau I^2)] \times f^2 |F(f)|^2 / [(f^2 - f_e^2)^2 + (f/2\lambda\tau)^2]$$

is established wherein τ = h/(2πKα).

Refer to FIG. 6.

FIG. 6 illustrates dependency of a frequency of ΔR(f). The upper drawing in FIG. 6 illustrates dependency of a frequency of a resistance increase component $\Delta R_{MT}$ due to the momentum transfer. The lower drawing in FIG. 6 illustrates dependency of a frequency of a resistance increase component $\Delta R_{ST}$ due to the spin transfer. Both of the dependency of frequency are quite different.

In the above context, the dependency is in the case of 1/τ = 20 MHz.

Supposing such a structure, the high frequency current "I" of 1 MHz to 100 MHz was let flow between the above-mentioned pair of Cu electrodes 13 and 14 at room temperature with the bound external magnetic field H being applied to measure ΔR(f).

In the above measurement, amplitude of the high frequency current "I" was set at 100 μA.

In the measurement, impedance Z between the pair of Cu electrodes 13 and 14 is measured in advance and a real number of Z is used as a resistance R (=ReZ) to apply voltage so that the amplitude of the high frequency current "I" would be 100 μA.

Refer to FIG. 7.

FIG. 7 illustrates dependency of a frequency of the measured resistance R. The upper drawing in FIG. 7 illustrates resistance in the case that the single magnetic domain wall is formed in the magnet loop. The lower drawing in FIG. 7 illustrates resistance in the case that no single magnetic domain wall exits. Calculating a difference between the above resistances allows ΔR(f) to be obtained.

The upper drawing in FIG. 7 shows that using a high frequency current for the drive current and utilizing the resonance allow the single magnetic domain wall to be moved with a low current around 100 μA as well as that the movement of the magnetic domain wall remarkably increases in the vicinity of the resonance frequency $f_e$ and alternating current resistance increases since the energy of the current is consumed for movement of the magnetic domain wall.

In Non-Patent Reference 5 (Applied Physics Letters, Vol. 84, No. 15, p. 2820-p. 2822, 12 Apr. 2004), reported is that applying a pulse current of 0.4 nano-second allows the current necessary for movement of the single magnetic domain wall to be small. A cause thereof, however, is not made clear.

This is considered to be because the single magnetic domain wall is enabled to move with a low current since a high frequency component is included in the case of Fourier-developing the pulse current, and thereby, a part of the high frequency component is accorded with the above-mentioned resonance frequency. Non-Patent Reference 5 can be a supporting evidence for proving the right of the principle of the invention but cannot immediately lead a technical idea of lowering the current due to the resonance.

Figure 8:
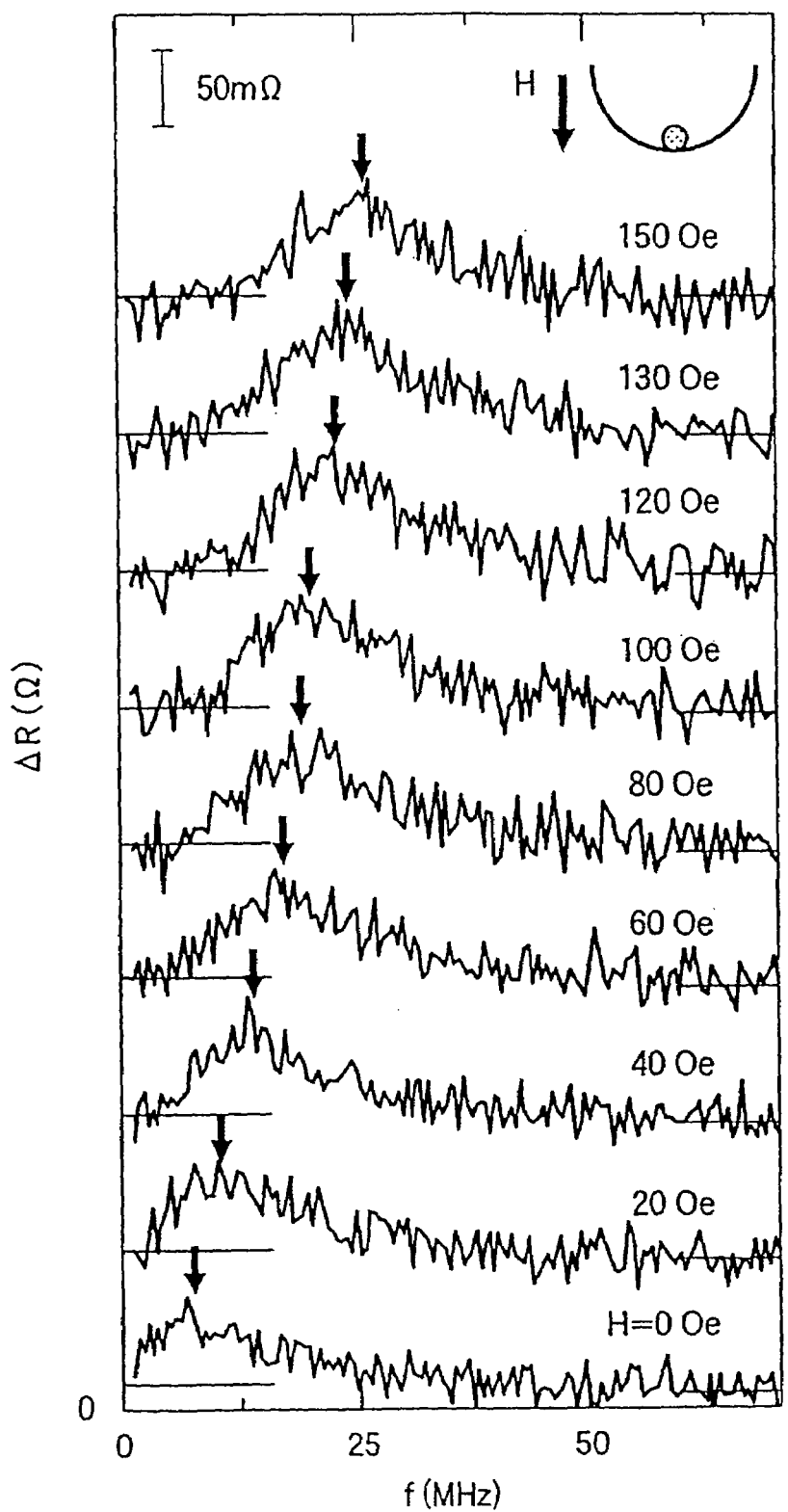
FIG. 8 illustrates frequency dependency of $\Delta R(f)$.

Refer to FIG. 8.

FIG. 8 illustrates dependency of a frequency of ΔR(f) in the case that the bound external magnetic field H is swept in a range from 0 [Oe] to 150 [Oe] under the above-mentioned drive current. As shown in FIG. 8, it can be seen that the resonance frequency $f_e$ becomes large as the bound external magnetic field H becomes large.

Figure 9:
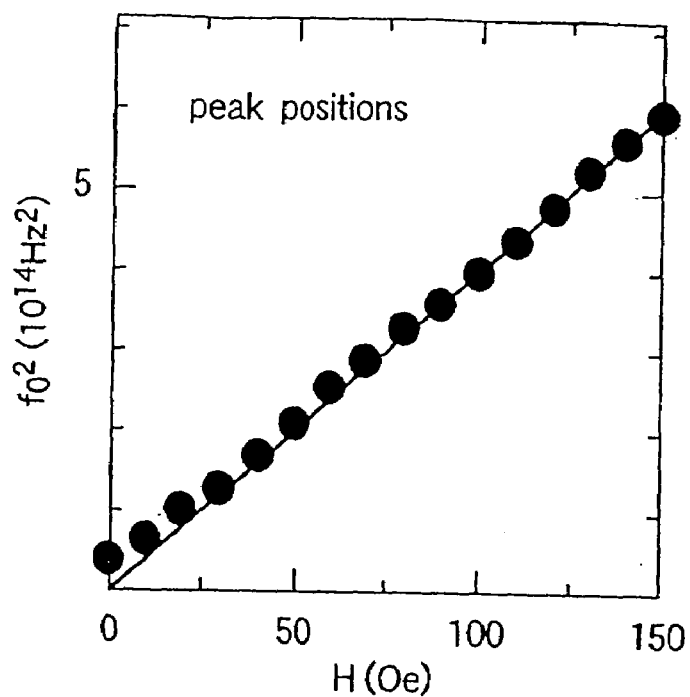
FIG. 9 illustrates dependency of a bound external magnetic field H of a resonance frequency $f_e$.

Refer to FIG. 9.

FIG. 9 illustrates dependency of the bound external magnetic field H with the resonance frequency $f_e$. As shown in FIG. 9 in which the vertical axis shows the square of the resonance frequency $f_e$, it was confirmed that $f_e^2$ is substantially proportional to H.

This is a result not contradictory to the above equation:

$$f_e^2 = Q_M H/(4\pi^2 mr)$$

This means that the resonance frequency $f_e$ of the magnetic domain wall, namely, a resonance frequency can be greatly changed in accordance with the bound external magnetic field H in the case that the magnetic domain wall is confined in the magnetic domain wall potential varying in curvature in accordance with the size of the bound external magnetic field H.

When a real number of each factor is substituted for the relational expression to carry out fitting for obtaining the mass "m" of the magnetic domain wall, the following value was obtained:

$$m=(6.55\pm0.06)\times10^{-23} \text{ [kg]}$$

The value results in a value not contradicting a value of $m\sim1\times10^{-22}$ kg obtained by substituting a value of $\lambda=70$ nm for an equation:

$$m=\hbar^2 N/(4\pi^2 K\lambda^2)$$

which is expected as the mass of a conventional magnetic domain wall.

In the above context, "N" denotes a spin number in the single magnetic domain wall, namely, a number of an atomic having a spin and is a whole atomic number in a ferromagnet.

Figure 10:
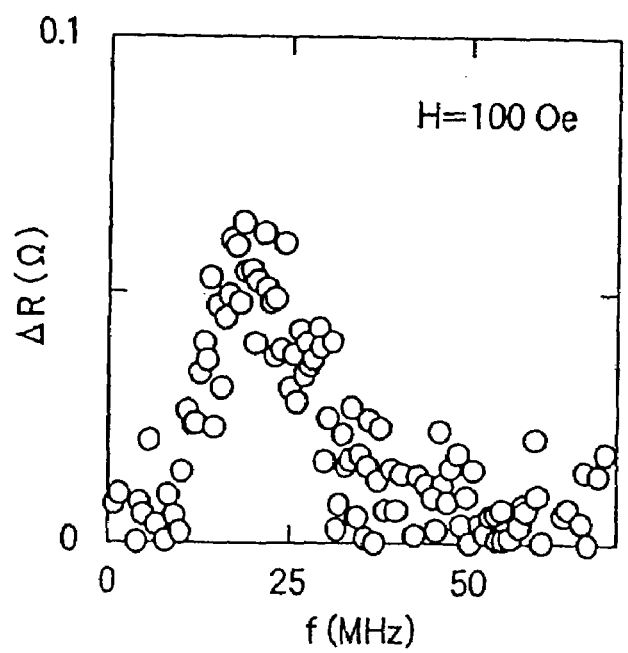
FIG. 10 is a plot diagram of $\Delta R$ measured under a condition of H=100 [Oe].

Refer to FIG. 10.

FIG. 10 is a plot diagram in which ΔR measured under a condition of H=100 [Oe] is reasonably selected for plotting from the result of the above-mentioned measurement. Smoothing the plot diagram to compare the same with FIG. 6, it turned out against the conventional expectations that the resistance increase component $\Delta R_{MT}$ due to the momentum transfer greatly contributed to the change in resistance ΔR while the resistance increase component $\Delta R_{ST}$ due to the spin transfer contributed little.

This does not contradict a result of $F_{MT}\gg F_{ST}$ at the frequency "f", which is 100 MHz in order, when each numeral is substituted for each factor of the above-mentioned equation $F(f)=F_{MT}+F_{ST}$. This contributed to confirm that the above approximation was right.

Therefore, in accordance with the above result, utilizing the resonance phenomenon in the case of applying the high frequency current as the drive current allows the magnetic domain wall to be moved by applying the current one or two digits smaller than the case of applying the direct current, contrary to the conventionally common knowledge. Further, a magnetic memory whose writing current and consumption power are lower than the conventional current and power can be achieved when the existence of the magnetic domain wall is made correspond to "0" and "1".

Figure 11:
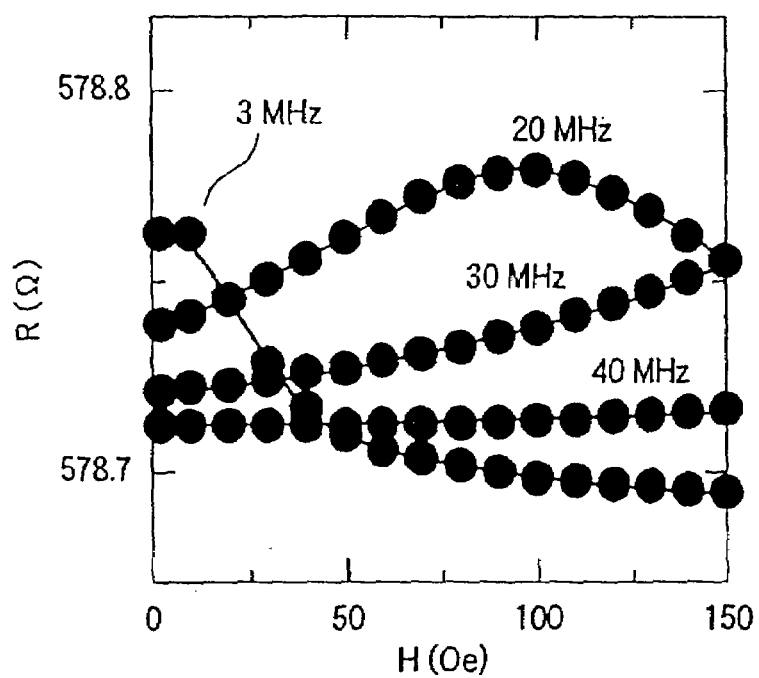
FIG. 11 illustrates dependency of a bound external magnetic field H of a resistance $R_{withDW}$.

Refer to FIG. 11.

FIG. 11 illustrates dependency of a bound external magnetic field H of resistance $R_{withDW}$ of the magnet loop for each frequency of the high frequency current, the magnet loop in which the single magnetic domain wall is formed. Enlarging the bound external magnetic field H allows the resistance $R_{withDW}$ to move from high resistance to low resistance when the frequency is low like 3 MHz.

On the other hand, enlarging the bound external magnetic field H allows the resistance $R_{withDW}$ to move from low resistance to high resistance in the case that the frequency is 20 MHz or 30 MHz.

In a condition of the experiment in this time, no resonance frequency exists in a high frequency area of 25 MHz or more in a range of 0 [Oe] to 150 [Oe], as obviously shown in FIG. 8.

Accordingly, in this case, changing the bound external magnetic field H with the high frequency current including the resonance frequency being applied to the magnet loop including the single magnetic domain wall introduced allows movement from low resistance to high resistance or from high resistance to low resistance, namely, readout of data of "0" or "1" to be enabled. This allows only a single magnet loop to form a magnetic device such as a magnetic sensor and a magneto-resistance effect element.

A multi-layer structure is not required differently from a conventional spin valve element in the case of use as a magneto-resistance effect element. This allows a magnetic head to be formed into a thinner film and element resistance to be decreased in principle more than the case of the conventional tunnel magneto-resistive (TMR) element. Accordingly, the consumption power can be reduced.

Embodiment 2

Figure 12:
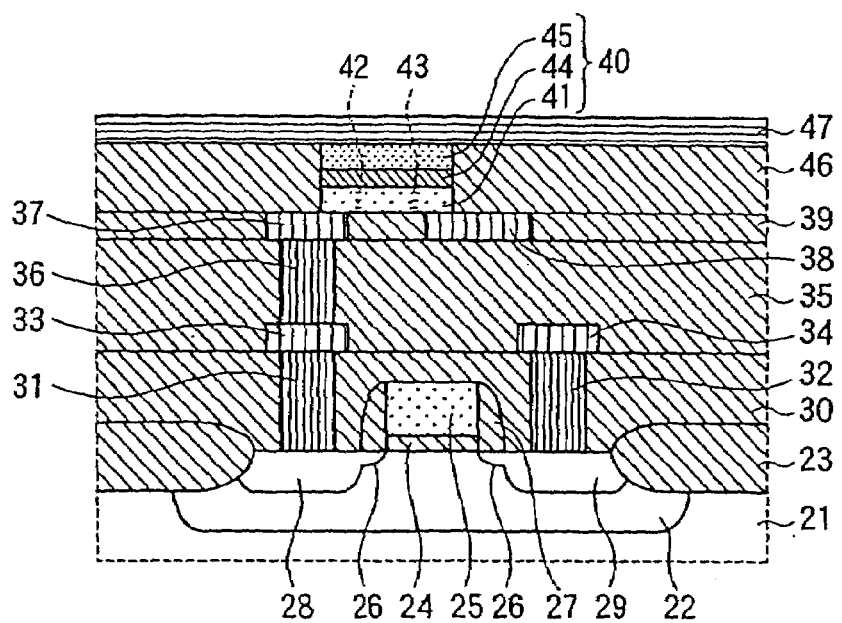
FIG. 12 is a schematic sectional view of an integral part of an MRAM in Embodiment 2 of the invention.
Figure 13:
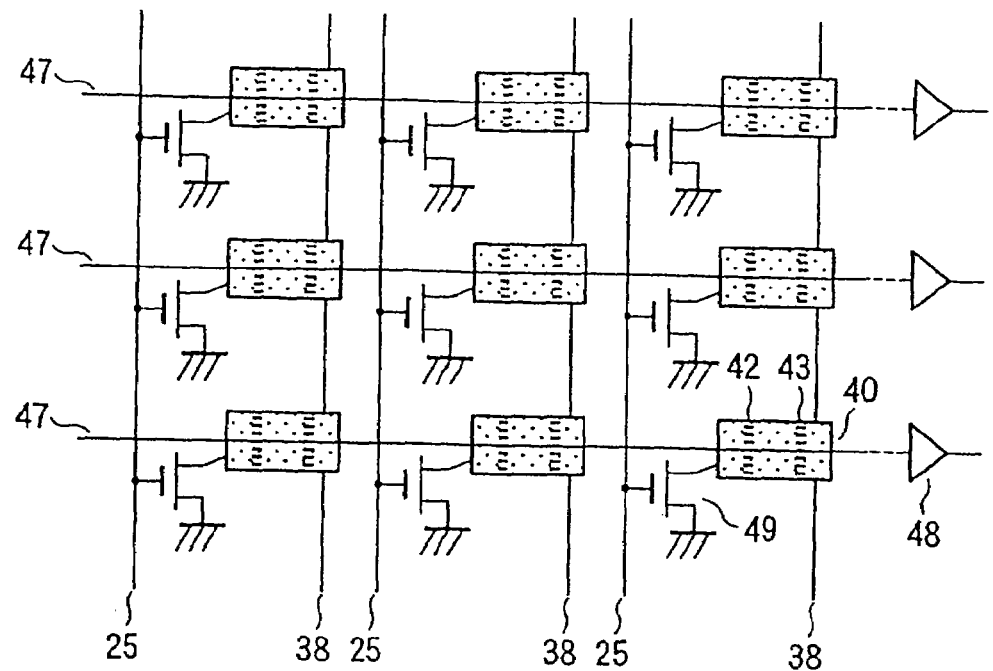
FIG. 13 is an equivalent circuit diagram of an MRAM in Embodiment 2 of the invention.
Figure 14:
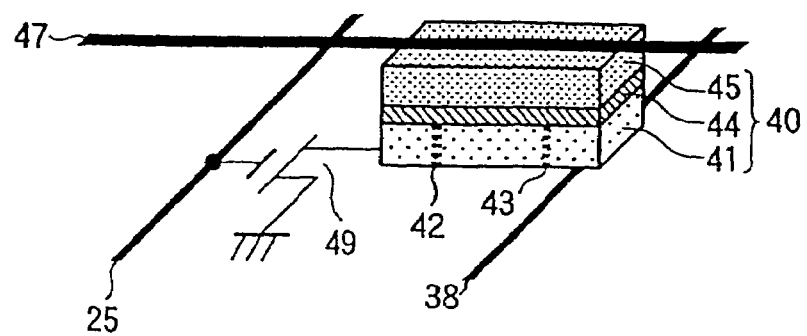
FIG. 14 shows a conceptual structure of a magnetic memory cell in Embodiment 2 of the invention.

Now, described will be an MRAM in Embodiment 2 of the invention, made reference to FIGS. 12 to 14. The MRAM is a current induction magnetic domain wall moving type MRAM, which utilizes in writing data a phenomenon capable of moving the single magnetic domain wall with a low current by using high frequency current and by utilizing resonance, the phenomenon obtained from the result of Embodiment 1 described above. The external bound magnetic field H is not applied for the operation.

Refer to FIG. 12.

FIG. 12 is a schematic sectional view of an integral part of an MRAM in Embodiment 2 of the invention. In FIG. 12, a p-type well area 22 is first formed in a predetermined area of an n-type silicon substrate 21, the n-type silicon substrate 21 is selectively oxidized to form an element separation oxidation film 23, and then, a gate electrode made from WSi to be a sense line 25 for reading out is formed in an element forming area through a gate insulation film 24 to form an n⁻-type LDD (lightly doped drain) area 26 by injecting an ion such as As with the gate electrode used as a mask.

Following to the above, an $SiO_2$ film is deposited on a whole surface and anisotropic etching is carried out to form a side wall 27. An ion such as As is then injected again to form an n⁺-type drain area 28 and an n⁺-type source area 29. After the above, a thick first interlayer insulation film 30 formed from a TEOS (tetra-ethyl-ortho-silicate)-NSG film is formed to form contact holes reaching the n⁺-type drain area 28 and the n⁺-type source area 29. The contact holes are embedded double through Ti/TiN to form W plugs 31 and 32.

Next to the above, patterning is performed after deposition of TiN/Al/TiN on the whole surface, for example, to form a grounding wire 34 connected to a connection conductor 33 and the n⁺-type source area 29. A thick second interlayer insulation film 35 formed from the TEOS-NSG film is then formed again to form a contact hole reaching the connection conductor 33. The contact hole is embedded double through Ti/TiN to form a W plug 36.

Subsequently, patterning is performed again after deposition of TiN/Al/TiN on the whole surface to form a lower electrode 37 and a word line 38 for writing the sense line 25 parallel. A thick third interlayer insulation film 39 formed from a TEOS-NSG film is then deposited again to carry out CMP (chemical and mechanical polishing) evening until the lower electrode 37 is exposed.

After the above, a lift-off method is used similarly to Embodiment 1 to deposit an $Ni_{81}Fe_{19}$ layer 41, which is 45 nm in thickness, for example. Si or Ge ion is then locally injected in two places to deteriorate the magnetic characteristics, so that pinning areas 42 and 43 in which the magnetic domain wall potential energy is low are formed.

Following to the above, a tunnel insulation layer 44 formed from $Al_2O_3$, which is 1 nm in thickness, for example, and a CoFe layer 45, which is 20 nm in thickness, for example, are deposited in order for removing a photo resist. This causes a magnetic storage part 40 having an $NiFe/Al_2O_3$ (or MgO)/CoFe lamination structure to be formed.

The size of the magnetic storage part 40 should be within a range that an effect of the resonance phenomenon of the high frequency current appears in movement of the magnetic domain wall. The smaller the size is, the more significant the effect appears. Accordingly, a smaller size is better. The size is set so that the width would be 10 to 500 nm and the length would be 50 to 5000 nm, namely, 50 nm×500 nm, for example, although it depends on a limit of a processing step such as a lithography process.

A thin fourth interlayer insulation film 46 formed from a TEOS-NSG film is deposited again after the above to even the fourth interlayer insulation film 46 by CMP until the CoFe layer 45 is exposed.

Following to the above, a multi-layered conductive layer having a TiN/Al/TiN structure is deposited on a whole surface. Patterning is then carried out to form a bit line 47 so as to extend in a direction crossing at right angle with the word line 38 for writing. A basic structure of the MRAM is thus completed.

Refer to FIG. 13.

FIG. 13 is an equivalent circuit diagram of the above-mentioned MRAM. In FIG. 13, the magnetic storage part 40 is arranged at an intersection of the word line 38 and the bit line 47 and a sense amplifier 48 is arranged to be connected to an end of the bit line 47.

Refer to FIG. 14.

FIG. 14 shows a conceptual structure of a magnetic memory cell. In FIG. 14, it is arranged that the CoFe layer 45 of the upper part of the magnetic storage part 40 be connected to the bit line 47, one end of the lower $Ni_{81}Fe_{19}$ layer 41 be connected to the n⁺-type drain area 28 forming an access transistor 49 and the other end be connected to the word line 38.

In the above case, in a process for magnetization to the CoFe layer 45 having coercive force larger than that of NiFe, which is used as a pinned layer, a direction of the magnetization is determined by forming a film with a magnetic field being applied. On the other hand, a magnetic field is applied to the $Ni_{81}Fe_{19}$ layer 41 for magnetization and the external magnetic field is reduced to finally achieve a residual magnetization condition in which magnetization is small. This causes a single magnetic domain wall 50 to be introduced into any one of the pinning areas 42 and 43.

Figure 15:
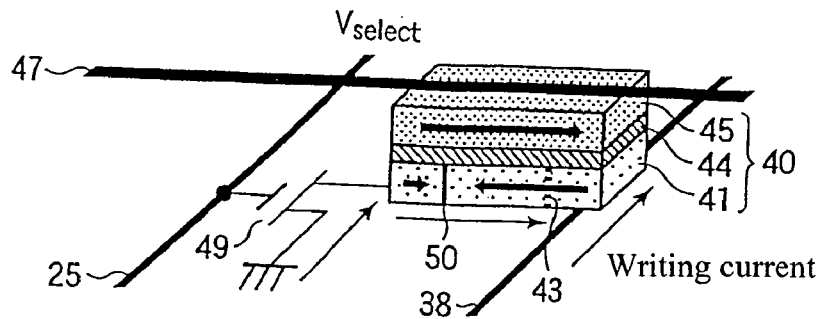
FIG. 15 shows a conceptual structure of a magnetic memory cell in writing in Embodiment 2 of the invention.

Refer to FIG. 15.

FIG. 15 shows a conceptual structure of a magnetic memory cell in writing. As shown in FIG. 15, in writing to the magnetic storage part 40, $V_{select}$ is applied to the sense line 25 to turn on the access transistor 49 while the potential of the word line 38 is set so that the writing current in which the high frequency current is superposed on the direct current would flow from an grounding wire connected to the source area of the access transistor 49 to the word line 38.

At that time, the electron flows from the word line 38 to the access transistor 49 as described in FIG. 20. Accordingly, the single magnetic domain wall 50 moves to the left pinning area 42. This causes a right magnetic section to be large in the $Ni_{81}Fe_{19}$ layer 41. The magnetization direction is relatively anti-parallel to that of the CoFe layer 45, which is used as the pinned layer. This causes a high resistance condition.

The frequency of the high frequency current in the writing current in the above case is to be set so as to be a resonance frequency determined on the basis of the magnetic domain wall potential formed in the vicinity of the pinning areas 42 and 43. The direct current is to move the single magnetic domain wall 50 resonant with the high frequency current in a specific direction.

On the other hand, in order to achieve a low resistance condition, a writing current is let flow between the grounding wire connected to the source area of the access transistor 49 and the word line 38 in a direction opposite to the case in FIG. 15 to move the single magnetic domain wall 50 to the right pinning area 43. This causes the left magnetic section in the $Ni_{81}Fe_{19}$ layer 41 to be enlarged, so that the magnetization direction thereof is relatively parallel to that of the CoFe layer 45. This allows the low resistance condition to be achieved.

Figure 16:
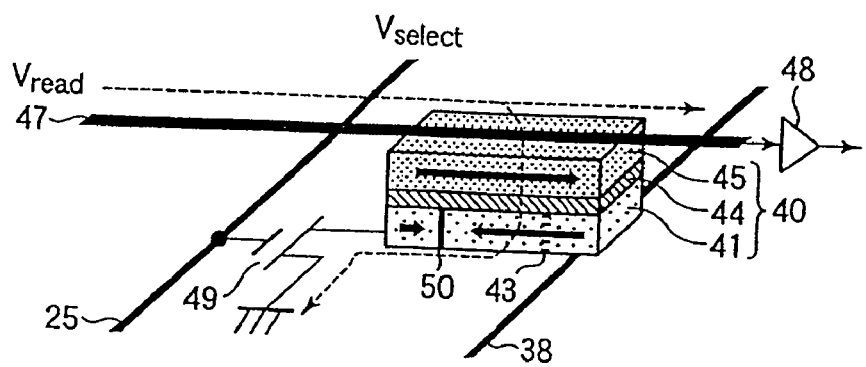
FIG. 16 shows a conceptual structure of a magnetic memory cell in readout in Embodiment 2 of the invention.

Refer to FIG. 16.

FIG. 16 shows a conceptual structure of a magnetic memory cell in readout. As shown in FIG. 16, in readout from the magnetic storage part 40, $V_{select}$ is applied to the sense line 25 to turn the access transistor 49 on while $V_{read}$ is applied to the bit line 47. The current flowing into the bit line 47 is measured by means of the sense amplifier 49 to detect that a high resistance condition is achieved between the sense line 25 and the bit line 47.

As described above, the high frequency current including a resonance frequency component is let flow not into the magnetic field but only into the $Ni_{81}Fe_{19}$ layer 41, which is to be used as a writing layer, in writing in an MRAM in Embodiment 2 of the invention. This allows the current to be decreased, and thereby, generation of the Joule heat to be reduced, so that the consumption power can be reduced.

Further, the word line 38 for writing is formed in a same process as the lower electrode 37. This allows a lamination structure to be simplified by one layer, compared with a conventional magnetic field writing type MRAM.

Moreover, differently from a structure in which the spin polarization current is let flow into the writing layer, the structure disclosed in Patent References 1 to 3 mentioned above, the structure for a flow of the spin polarization current is unnecessary and a magnetic semiconductor essentially requiring cryogenic drive is also unnecessary to be used. This allows the structure of the invention to be simplified and drive at room temperature to be achieved.

Embodiment 3

Now, an MRAM in Embodiment 3 of the invention will be described, made reference to FIG. 17. In the MRAM, the two pinning parts of the MRAM in Embodiment 2 are formed not by ion injection but by introduction of a shape defect. Accordingly, described will be only a structure of the magnetic storage part.

Figure 17:
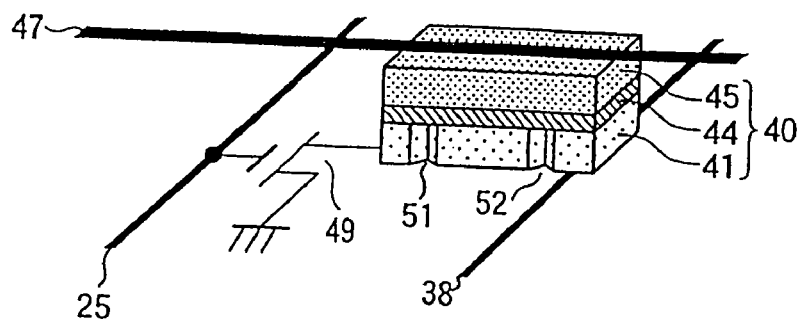
FIG. 17 is a schematically perspective view of a magnetic storage part forming an MRAM in Embodiment 3 of the invention.

Refer to FIG. 17.

FIG. 17 is a schematically perspective view of a magnetic storage part forming an MRAM in Embodiment 3 of the invention. In FIG. 17, narrow parts 51 and 52 are formed in two places of the $Ni_{81}Fe_{19}$ layer 41, which is to be used as a data writing layer, so as to be the pinning parts of the single magnetic domain wall 50.

The narrow parts 51 and 52 in the above case can be formed by selective etching after the film is formed or by means of a lift-off pattern shape. The degree of the narrow width can be determined so that the necessary magnetic domain wall potential can be achieved in accordance with a three-dimensional size of the $Ni_{81}Fe_{19}$ layer 41, which is to be used as a data writing layer.

Embodiment 4

Now, an MRAM in Embodiment 4 of the invention will be described, made reference to FIG. 18. In the MRAM, the shape defect to be the two pinning parts of the MRAM in Embodiment 2 is formed not by the narrow parts but by thin parts. The structure other than the above is similar to that of Embodiment 2. Accordingly, described will be only a structure of the magnetic storage part.

Refer to FIG. 18.

FIG. 18 is a schematically perspective view of a magnetic storage part forming an MRAM in Embodiment 4 of the invention. In FIG. 18, thin parts 53 and 54 are formed in two places of the $Ni_{81}Fe_{19}$ layer 41, which is to be used as a data writing layer, so as to be the pinning parts of the single magnetic domain wall 50.

The thin parts 53 and 54 in the above case can be achieved by forming the $Ni_{81}Fe_{19}$ layer 41, which is to be used as a data writing layer, in two-stage growth.

For example, a thin insulation film is formed on the third interlayer insulation film 39 in FIG. 12, an area for forming a thick part is etched, and then, a resist pattern is used as a lift-off mask as it is to form an $Ni_{81}Fe_{19}$ layer. Subsequently, the resist pattern is removed to form the $Ni_{81}Fe_{19}$ layer, the tunnel insulation layer 44 and the CoFe layer 45 by selective etching after the film is formed or by means of a lift-off pattern shape.

The degree of the thin thickness of the thin parts 53 and 54 in the above case can be determined so that the necessary magnetic domain wall potential can be achieved in accordance with a three-dimensional size of the $Ni_{81}Fe_{19}$ layer 41, which is to be used as a data writing layer.

Embodiment 5

Now, an MRAM in Embodiment 5 of the invention will be described, made reference to FIG. 19. In the MRAM, an anti-ferromagnetic layer is formed on the CoFe layer of the magnetic storage part of the MRAM in Embodiment 2. The structure other than the above is similar to that of Embodiment 2. Accordingly, described will be only a structure of the magnetic storage part.

Refer to FIG. 19.

FIG. 19 is a schematically perspective view of a magnetic storage part forming an MRAM in Embodiment 5 of the invention. In FIG. 19, an anti-ferromagnetic layer 56 formed from PdPtMn for fixing the magnetization direction of the CoFe layer 45 is provided on the CoFe layer 45, which is to be used as a magnetization fixing layer of a magnetic storage part 55.

As described above, providing the anti-ferromagnetic layer 56 on the magnetization fixing layer allows magnetization of the magnetization fixing layer to be stably maintained.

The respective embodiments of the invention have been described above. The invention, however, is not limited to the structures and conditions described in the respective embodiments. Various kinds of modification can be considered.

For example, the shape of the magnet loop is a half-arc for the purpose of precisely measuring the current induction magnetic domain wall movement and precisely introducing the mass of the single magnetic domain wall in Embodiment 1. The shape, however, is not necessarily a precise half-arc as long as such a phenomenon can be accurately grasped. The shape may be another secondary curved shape such as a parabola. In this case, a measurement sample can be used for measuring the resonance frequency to apply the high frequency current including a measured resonance frequency component.

Further, the magnetic material in which the single magnetic domain wall is introduced is made of $Ni_{81}Fe_{19}$ in the above respective embodiments. The magnetic material, however, is not limited to be made of $Ni_{81}Fe_{19}$ but to be made of NiFe having another composition ratio, CoFe and the like. In short, the magnetic material can be made of any material so long as it is the ferromagnet or a ferrimagnet.

Moreover, a narrow part is formed in order to form a shape defect area in Embodiment 3 while a thin part is formed in order to form a shape defect area in Embodiment 4. The invention, however, is not limited to forming the narrow part or the thin part. A narrow and thin area can be also formed.

In addition, the data writing layer is provided on the lower side in Embodiments 2 to 5. It may be possible that the data writing layer is provided on the upper side while the magnetization fixing layer is provided on the lower side. In this case, it is enough to modify a via structure and a wiring structure so that the sense line would be connected to the data writing layer provided on the upper side.

Furthermore, the magnetic storage part is formed into a tunnel magneto-resistive element structure in Embodiments 2 to 5. The invention, however, is not limited to the tunnel magneto-resistive element structure. The magnetic storage part may be formed from a spin valve film having a CPP structure instead of an $Al_2O_3$ film, using a nonmagnetic conductor layer made of Cu and such.

In Embodiments 3 and 4, the magnetic storage part is formed from a three-layer structure including the data writing layer, the nonmagnetic middle layer and the magnetization fixing layer, using the coercive force of the magnetization fixing layer. It may be possible, however, to provide an anti-ferromagnetic later, which is made of PdPtMn and such for fixing magnetization in the magnetization fixing layer similarly to Embodiment 5, to form the magnetic storage part from a four-layer structure including the data writing layer, the nonmagnetic middle layer, the magnetization fixing layer and the anti-ferromagnetic layer.

Arrangements of the bit line, the word line and the sense line for forming a memory array in Embodiments 2 to 5 are just examples. Accordingly, various kinds of wiring structure, and consequently, various kinds of circuit structure are possible. A circuit structure shown in FIG. 5 of Patent Reference 1 mentioned above, for example, may be used.

INDUSTRIAL APPLICABILITY

As an example of application of the invention, typically considered can be an MRAM. It is also possible to let the high frequency current flow into the magnet wire per se, the magnetic wire having the magnetic domain wall potential, and use external magnetic field strength dependency of an alternating current resistance to form a magnetic sensor. Providing the magnetic sensor in a reproducing head allows an ultra thin magnetic head to be formed.

The invention claimed is:

1. A magneto-resistance effect element comprising at least:
a magnet wire for forming magnetic domain wall potential binding a single magnetic domain wall:
a magnetic field applying means for generating a magnetic field for introducing the single magnetic domain wall into the magnet wire; and
a drive current applying means for applying a current including a resonance frequency component determined on the basis of the magnetic domain wall potential,
wherein the magnet wire is formed from an arc-shaped magnet loop and comprises a bound external magnetic field applying means for applying a bound external magnetic field binding the single magnetic domain wall and the magnetic domain wall potential depends on the shape of the magnet loop and the bound external magnetic field.

2. The magneto-resistance effect element according to claim 1, wherein
the magnetic domain wall potential is formed in any of a magnetic deterioration area locally formed in the magnet wire and a shape defect area.

3. A magneto-resistance effect element comprising at least:
a magnet wire for forming magnetic domain wall potential binding a single magnetic domain wall;
a magnetic field applying means for generating a magnetic field for introducing the single magnetic domain wall into the magnet wire; and
a drive current applying means for applying a current including a resonance frequency component determined on the basis of the magnetic domain wall potential,
wherein the current including a resonance frequency component, applied from the drive current applying means, is a high frequency current including a resonance frequency component.

4. The magneto-resistance effect element according to claim 3,
wherein the magnet wire is formed from an arc-shaped magnet loop and comprises a bound external magnetic field applying means for applying a bound external magnetic field binding the single magnetic domain wall, and
the magnetic domain wall potential depends on the shape of the magnet loop and the bound external magnetic field.

5. The magneto-resistance effect element according to claim 3, wherein
the magnetic domain wall potential is formed in any of a magnetic deterioration area locally formed in the magnet wire and a shape defect area.

* * * * *